United States Patent [19]

Naster et al.

[11] Patent Number: 4,605,912

[45] Date of Patent: Aug. 12, 1986

[54] CONTINUOUSLY VARIABLE PHASE SHIFTING ELEMENT COMPRISED OF INTERDIGITATED ELECTRODE MESFET

[75] Inventors: Ronald J. Naster; John A. Windyka, both of Liverpool; Allen R. Wolfe, Sauquoit, all of N.Y.

[73] Assignee: General Electric Company, Syracuse, N.Y.

[21] Appl. No.: 604,192

[22] Filed: Apr. 26, 1984

Related U.S. Application Data

[63] Continuation-in-part of Ser. No. 327,133, Dec. 3, 1981, abandoned.

[51] Int. Cl.[4] .......... H03H 11/20

[52] U.S. Cl. .......... 333/164; 333/161; 357/23.7; 357/23.14

[58] Field of Search .......... 333/164, 161, 156, 101, 333/103, 104, 246, 247; 307/239, 241, 242, 243, 244, 248, 249, 571, 581, 582, 594, 595; 357/23.7, 23.14

[56] References Cited

U.S. PATENT DOCUMENTS

| | | | |
|---|---|---|---|
| 3,517,348 | 6/1970 | Frost | 333/161 |
| 3,602,738 | 8/1971 | Bohm | 307/244 |
| 4,160,261 | 7/1979 | Casey, Jr. et al. | 357/16 X |
| 4,238,745 | 12/1980 | Schwarzmann | 333/164 |
| 4,393,578 | 7/1983 | Cady et al. | 357/22 X |

FOREIGN PATENT DOCUMENTS

| | | | |
|---|---|---|---|
| 0115368 | 9/1980 | Japan | 357/22 |

*Primary Examiner*—Eugene R. Laroche
*Assistant Examiner*—Benny T. Lee
*Attorney, Agent, or Firm*—Richard V. Lang; Carl W. Baker

[57] ABSTRACT

A bidirectional continuously variable phase shifting element is described for incorporation in a monolithic microwave integrated circuit (a circuit which combines both passive and active circuit elements). The preferred active device for use in the phase shifting element is a variable resistance field effect transistor (MESFET), while the preferred passive circuit element is a short transmission line interconnecting the principal electrodes. A variable phase shift for an RF signal passing through the phase shifting element is obtained by adjusting the gate potential of the MESFET between full conduction and nonconduction. The change in conductivity of the MESFET causes the serial impedance of the phase shifting element to vary from a substantially resistive impedance to a substantially capacitively reactive impedance arrangement, which requires only a single active device, is applicable to frequencies generally above 1 GHz, and provides phase shifts up to 45° with reasonable insertion loss and return loss.

24 Claims, 11 Drawing Figures

ON-STATE

ON-STATE
(REDUCED MODEL)

OFF-STATE

OFF-STATE
(REDUCED MODEL)

FIG. 4A SOS MESFET FOR ON-STATE
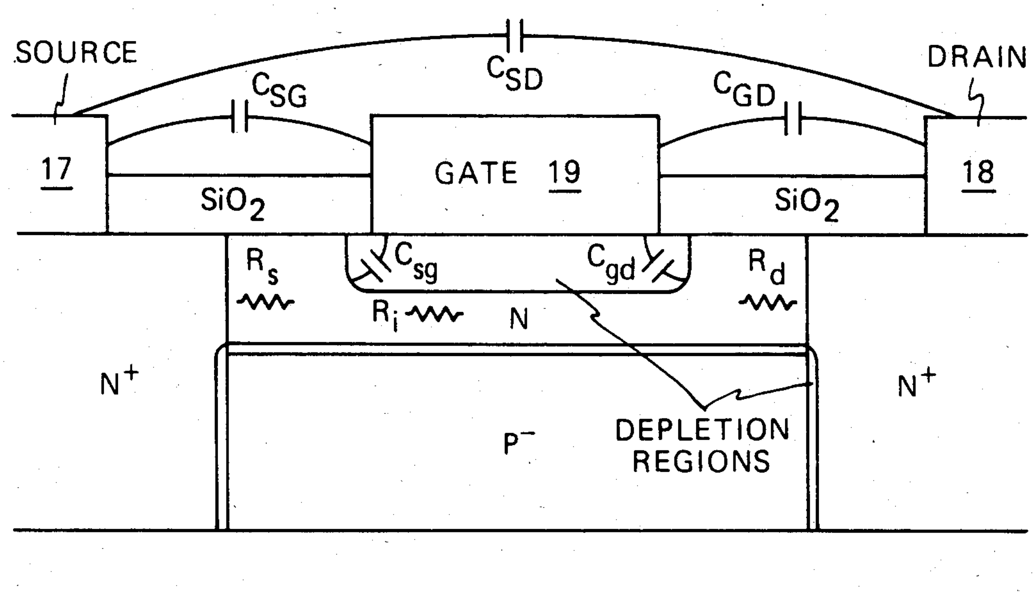
FIG. 4B SOS MESFET FOR OFF-STATE
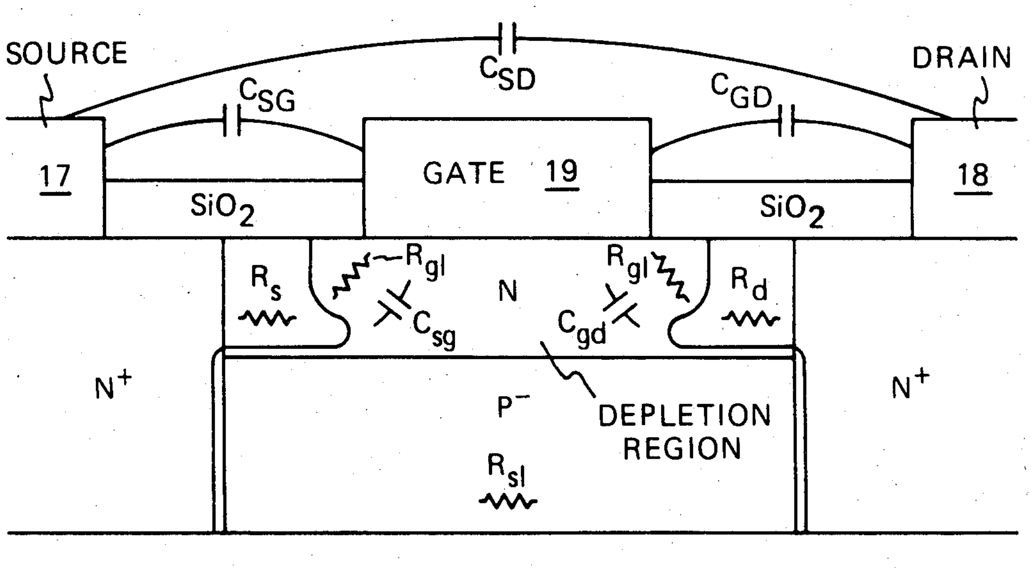

CONTINUOUSLY VARIABLE PHASE SHIFTING ELEMENT COMPRISED OF INTERDIGITATED ELECTRODE MESFET

This invention was made in the course of or under contract No. F30602-79C-0159 awarded by the U.S. Air Force.

RELATED APPLICATION

This is a continuation-in-part of copending U.S. patent application Ser. No. 327,133, filed Dec. 3, 1981 entitled "A Continuously Variable Phase Shifter", now abandoned.

BACKGROUND OF THE INVENTION

1. Field of the Invention

This invention is related to integrated circuit phase shifters, and, more particularly, to an integrated circuit configuration, which can provide a controlled continuously variable phase shift.

2. Description of the Prior Art

Continuously variable phase shifters using varactor diodes have been employed in the prior art. A typical configuration uses these devices as the terminating element of the two output ports of a quadrature hybrid circuit. By adjusting the capacitance of such phase shifters, the phase of the reflected signal is changed, thereby producing the desired phase shift. Varactor diodes have a sufficiently broad capacitance range to produce variable phase shifts of up to 180 degrees. However, these devices are not readily amenable to monolithic microwave integrated circuit (MMIC) processing, and therefore, they do not present the MMIC circuit designer with a practical phase shifter configuration.

Prior art attempts to provide MMIC compatible phase shifting including the use of MESFET's which are MMIC compatible. For such devices, it has been demonstrated that by varying the gate-source capacitance of a FET a zero degree to fifteen degree variable phase shift can be obtained. These approaches have used MESFETs in a common source amplifying mode, which have the objection of being unidirectional devices.

Another prior art approach to providing a continuously variable phase shifter employs a dual gate FET used as both a phase shifting and amplifying element. In this configuration with a radio frequency (rf) voltage source having an impedance connected to a first gate and a load connected to the drain, the transmission phase can be controlled by varying the bias voltage at the second gate, which changes the parallel resonance between the inductor and the source to gate capacitance. This circuit has been demonstrated to provide a 0 degree to 90 degree phase shift. However, this approach has the above-mentioned limitation of operating only in a common source amplifying mode and is unidirectional.

A further description of a related but subsequently invented phase shifter is disclosed in U.S. application Ser. No. 438,028, filed Nov. 1, 1982, now U.S. Pat. No. 4,471,330, issued Sept. 11, 1984, entitled "Digital Phase Bit for Microwave Operation" of R. J. Naster et al, and assigned to the Assignee of the present application. In that application, a digital phase shift is achieved using a pair of field effect transistors (FETs), operated in an on-off mode, each FET employing a shunting transmission line, and each shunted combination being serially connected by a transmission line whose length is selected to cancel reflections.

SUMMARY OF THE INVENTION

An object of the present invention is to provide an MMIC compatible phase shifter which provides continuously variable phase shifting in a bidirectional device.

A more specific object of the present invention is to provide a MMIC compatible phase shifter which employs a MESFET, which can be fabricated simultaneously with the remainder of the monolithic microwave integrated circuit.

It is a further object of the present invention to provide an improved continuously variable phase shifting element for microwave applications.

It is another object of the present invention to provide an improved continuously variable phase shifting element for microwave applications which may be fabricated on a semiconductor substrate.

It is a further object of the present invention to provide an improved continuously variable phase shifting element of monolithic design for microwave applications, which requires a single semiconductor device, is compact, has low insertion loss, low VSWR, is bidirectional, and is readily grounded for RF.

These and other objects of the invention are achieved in a novel variable phase shifting element operable over a selected band of frequencies and suited to integrated fabrication.

The phase shifting element comprises three transmission lines, a field effect transistor (FET), and means for applying a control potential to the gate of the FET. The first transmission line and the third transmission line are for interconnection. The field effect transistor (FET) is a variable resistance, bidirectional device having two principal electrodes and a gate electrode for control of conduction between the principal electrodes. The net impedance of the FET is primarily capacitively reactive when the FET is off and primarily resistive when the FET is on over the selected band. The first transmission line is connected to a first principal electrode; the third transmission line is connected to a second principal electrode of the FET; while the second transmission line, which exhibits an inductive reactance over the band, is connected between the principal electrodes to form with the FET a shunt combination.

When electromagnetic waves are transmitted through the phase shifting element, while the FET is maximally conductive, they pass substantially undivided through the FET to effect a first phase shift. When the FET is turned off, the electromagnetic waves divide at the shunt combination to effect a second phase shift.

The phase shifting element is completed by means for applying a control potential to the gate to cause said FET to assume a selected conductivity. The conductivity varied between the off state and the maximally conductive on state, to effect a desired phase shift.

In accordance with further aspects of the inventions, the second transmission line, which has an electrical length of less than approximately $\frac{1}{4}$ wavelength, may be represented by an equivalent $\pi$ network, exhibiting a series inductive reactance with shunting input and output capacitances. The shunt combination of the inductive reactance of the transmission line with the capacitive reactance of said FET, when not maximally conductive, exhibits a net serial impedance whose reactive part is inductive over the band.

The characteristic impedances of said first and third transmission lines are approximately the same, and the on-state resistance of the FET is low in relation to these transmission line impedances to minimize reflections and insertion loss when said FET is on. In addition, the capacitive reactance of the FET when off, is greater than the resistance of said FET when on, over said band, for optimizing loss and bandwidth.

The shunt combination of the resistance, and capacitive reactance of the FET as it becomes less conductive and the inductive reactance of the equivalent $\pi$ network representing said second transmission line are selected to minimize return loss and insertion loss over said band. More particularly, the inductive reactance of the second transmission line is less than the capacitive reactance of the FET when off. Thus, the adjustment of the conductivity of the FET produces a progressive conversion of the low serial resistance of the shunt combination in the FET on state to an impedance which is a predominantly inductive reactance in the FET off state. The net serial impedance of the shunt combination is selected in relation to the input and output impedance of the shunt combination to optimize phase shift while minimizing insertion loss and return loss over the band.

A preferred variable resistance FET is a Metal-Semiconductor (Schottky Gate) Field Effect Transistor (MESFET) using an interdigitated source and drain. The FET device may be of a silicon-on-sapphire or a gallium arsenide construction with the transmission lines and the FET being formed on a common monolithic substrate with a semiconducting region on one surface. In this construction, the transmission lines are unbalanced, being formed between defined conductors interconnecting the FET on said one surface of the substrate and a continuous conductive layer on the other surface of said substrate.

BRIEF DESCRIPTION OF THE DRAWINGS

The novel and distinctive features of the invention are set forth in the claims of the present application. The invention itself, however, together with further objects and advantages thereof, may best be understood by reference to the following description and accompanying drawings in which:

FIG. 3A is a substantially complete equivalent circuit for the fully conductive, "on" state, while FIG. 3B is a reduced equivalent circuit for the "on" state; FIGS. 3C and 3D are respectively complete and reduced equivalent circuit for the fully non-conductive "off" state (the device operating continuously between these limits);

FIG. 4A is a cross section of a variable resistance MESFET showing the interelemental capacitances, resistances and the depletion regions for the "on" state; FIG. 4B is a cross section of the same MESFET showing the interelemental capacitances, resistances and the depletion regions for the "off" state;

DESCRIPTION OF THE PREFERRED EMBODIMENT

Figure 1A:
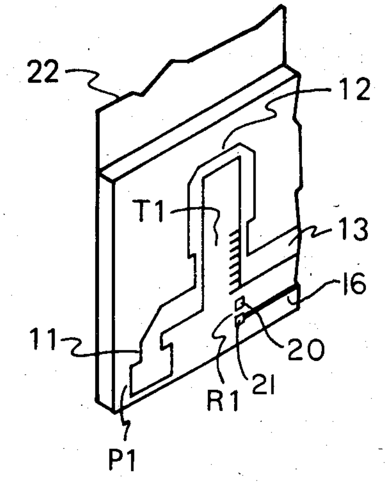
FIG. 1A is a perspective view of a novel continuously variable phase shifting element incorporating the invention and suited to fabrication on a monolithic substrate using microstrip transmission paths.
Figure 1B:
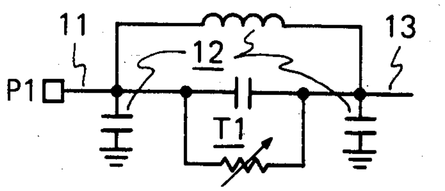
FIG. 1B is a simplified equivalent circuit representation of the phase element.
Figure 2:
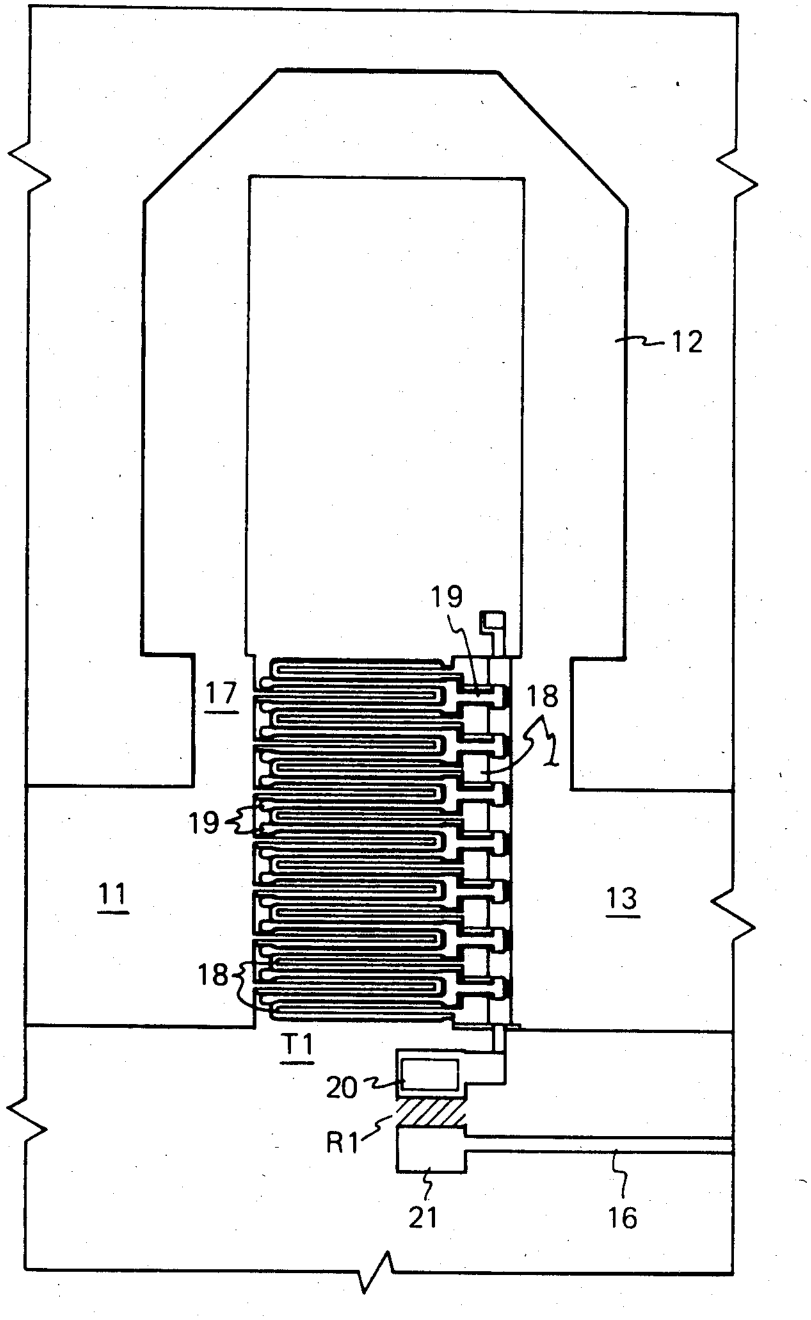
FIG. 2 is a more detailed plan view of the phase element more clearly showing a variable resistance MESFET and a shunting transmission path which comprises the phase element.

Referring now to FIGS. 1A, 1B and 2 there is shown a novel continuously variable phase shifting element for use in the gigahertz frequency range and suited to monolithic fabrication. In monolithic fabrication, high frequency transistors as well as inductors, capacitors and resistors are formed on the monolithic substrate having semiconducting regions on the upper surface thereof. High frequency transmission lines (11–13) are provided between circuit elements. These transmission lines are of the microstrip design in which conductors of defined width provided on the upper surface of the substrate act in conjunction with a continuous ground plane 22 provided on the under surface of the substrate to provide "unbalanced" microwave transmission paths.

As seen in FIG. 2, the continuously variable phase shifting element may be seen to comprise the three transmission lines 11, 12 and 13, earlier noted, and a variable resistance field effect transistor T1 formed in the semiconducting region whose principal electrodes 17 and 18 are of an interdigitated construction. The FET (T1) is connected in shunt with one of the transmission lines (12). The conductive state of T1 is dependent upon the potential applied to a gate electrode (19).

The continuously variable phase shifting element, depicted in FIGS. 1A, 1B and 2, is capable of producing a desired phase shift in a range which is ordinarily no greater than approximately 45°, and typically approximately $22\frac{1}{2}$°. The phase shifting element, which is controllable by controlling the gate bias, is bidirectional and by cascading a number of like elements, a larger phase shift necessary for a particular circuit application may be achieved.

Typically, the phase bit is required to produce the specified phase shift with a given accuracy (e.g. $22\frac{1}{2}° \pm 1°$) over a band of frequencies (e.g. 10% $f_o$, where $f_o$ is the center frequency). Other important criteria of the quality of performance of the phase shifting element include the insertion loss and the return loss or voltage standing wave ratio (VSWR). The designs herein described contemplate phase shifts over the frequency range of $\frac{1}{2}$ GHz to tens of GHz, with bandwidths typically of 10% of the center frequency (but bandwiths can also be larger or smaller) and return loss usually on the order of 20 db. The insertion losses are typically about 1 db, but depend on overall FET characteristics.

The invention thus provides a precision adjustment mechanism for phase control for high frequency systems, such as radar systems, in which reducing sidelobes can be facilitated by reducing phase errors.

In a particular example of the present invention, a large gate-width, 3500 microns, variable resistance MESFET was used with a shunting transmission line having 71 ohms impedance and 25 electrical degrees delay. Varying the negative gate bias produced the performance characteristics shown in FIG. 6. The operating frequency was in excess of 4 GHz.

Figure 6:
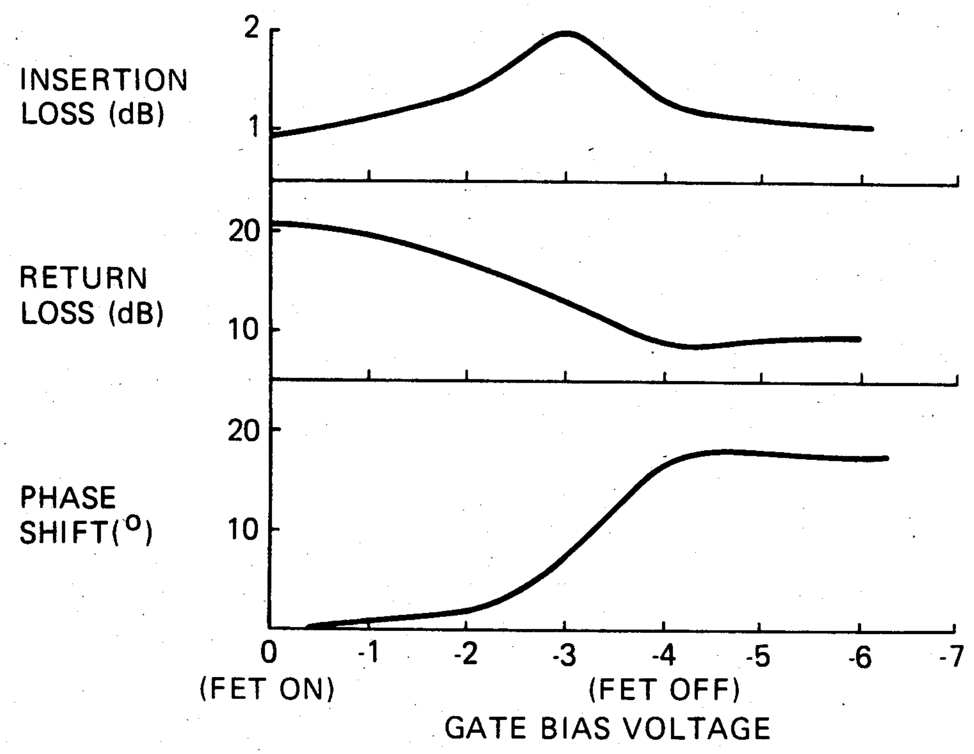
FIG. 6 is a graphical representation of the operating characteristics of a continuously variable phase shifting element built according to the present invention.

Referring to FIG. 6, an increase of the negative gate bias voltage from zero to −4 (plus) volts produced a change in phase shift from zero to approximately 17.5 degrees. This adjustment in gate bias caused a continuous change in the conductivity of the FET from a fully on to a fully off state. During the adjustment, the insertion loss, which always remained below 2 db, increased from approximately 0.8 db to 2 db. During the same adjustment, the return loss fell from approximately 21 db to approximately 9 db.

As shown in FIGS. 1A and 2, the variable phase shifting element is inserted between the pad P1 on the perimeter of the substrate, and an internal microstrip line 13. The pad P1 is connected via the microstrip line 11 to a first principal electrode 17 of MESFET T1. The shunting microstrip line 12 is connected between the microstrip line 11 and the principal electrode 17 on the one hand, and the principal electrode 18 and the internal microstrip line 13 on the other hand. The control potential is applied to the gate electrode 19 of T1 by the conductive line 16 via pad 20, RF isolating resistance R1 and pad 20. The microstrip lines 11 and 13 have the characteristic impedance of the system, typically 50 Ω, while the shunting microstrip line 12 has a higher characteristic impedance of 71 Ω as already noted.

The variable phase shift element comprises a shunt circuit combining the variable resistance FET T1 and the transmission line 12 which jointly pass the signal whose phase is to be shifted. The connection of the transmission line 12 between the principal electrodes 18 and 19 of the FET provides both a shunting microwave transmission path between the principal electrodes and a dc connection which places both principal electrodes at the same dc potential. This mode of biasing (VGS=0) is suitable for role reversal between input and output electrodes of the FET and for operating the FET as a passive (no gain) variable impedance. Thus, signal currents may enter the phase shift element from either the transmission line 11 or the transmission line 13. In the practical application, the gate potential is set at zero volts for maximum conduction, at the negative pinch-off voltage for minimum conduction, and is adjusted between these limits.

Assuming that the signal currents enter the phase shift element from the transmission line 11 (itself connected to the pad P1), the signal is applied to both the shunting transmission line 12 and to the leftmost principal electrode 17 of the FET. The shunting transmission line 12 thus provides a microwave transmission path from the left transmission line 11 to the right transmission line 13. The FET also provides a microwave transmission path from the right to the left transmission line. In the practical application, the gate potential is set at zero volts for maximum conduction and at the negative pinch-off voltage for minimum conduction.

FIG. 1B depicts the continuously variable phase shift element in a simplified equivalent circuit representation. In FIG. 1B, the phase shifting element which is connected between transmission lines 11 and 13 is seen to consist of five equivalent lumped impedances. The variable resistance FET is illustrated as a variable resistance shunted by a capacitance (not illustrated to be variable but which is slightly variable in fact). The variable resistance and capacitance representing the FET are connected in shunt with each other and between the transmission lines 11 and 13. The microstrip transmission line 12 is equivalently represented by a serial inductance with two shunting impedances at the end terminals of the inductance. In Figure lB the one terminal of the inductance and one terminal of one capacitance (representing the microstrip transmission line) is connected to the transmission line 11 and the other end terminal of the inductance and one terminal of the other capacitance is connected to the microstrip transmission line 13. The other terminals of the two capacitors representing the transmission line are connected to ground. Thus, in the serial path between transmission lines 11 and 13 one has three lumped circuit elements in parallel; the variable resistance and capacitance representing the FET and the inductance representing the transmission line.

The adjustment in phase of the incident signal with adjustment of gate potential of the FET may be explained, using the FIG. 1B equivalent circuit representation, in the following manner. If the gate electrode is at zero potential and the FET is at maximum conductivity, the principal signal currents between the transmission lines 11 and 13 will flow primarily through the FET. This assumes that the resistance of the FET in its highest conductive state has been designed to be substantially less than the equivalent capacitive reactance between the principal electrodes of the FET. It also should be substantially less than the inductive reactance of the shunting transmission line. In practice, the minimum resistance of the FET may be from 5 to 10 ohms while the capacitive reactance of the FET may be on the order of 50–200 Ω and the inductive reactance of the transmission line on the order of 50–80 Ω. Typically, the equivalent capacitance may be on the order of 1 picofarad (for a 4 GHz design) and the equivalent inductance may be on ther order of a nanohenry (for a 4 GHz design) to fulfill this requirement. Thus, at the designed operating frequency, these impedances will be substantially greater than the minimum resistance. Under these conditions, the shunt combination of the transmission lines and the FET will exhibit a nearly purely resistive phase shift, and this will represent the reference, minimum phase shift condition of the phase shifter.

The network reaches a maximally inductive reactive phase shift when the FET is of minimum conductivity. If the gate electrode of the FET is at the negative cutoff potential (−4 plus volts) and the FET is at minimum conductivity, the principal signal currents between the transmission lines 11 and I3 conducted by the phase shifting element will now divide between the FET and the shunting transmission line, and be primarily inductively reactive. This follows from the assumption that the resistance of the FET in the off state can be made substantially higher than its capacitive reactance. In practice, the off resistance can exceed 10,000 ohms. In a conventional interdigitated FET design, the capacity falls slightly (typically by a half) in going from the on state to the off state and for the design under discussion is on the order of from 100 Ω to 400 Ω of capacitive reactance. Thus, in an "off" state, the resultant FET current will be primarily attributable to the capacitive reactance. To achieve a greater and more accurately controlled phase shift, the inductive reactance from the shunt transmission line has been provided. This inductive reactance, which parallels the capacitive reactance of the FET, must be less than the capacitive reactance so that the resultant current will be primarily attributable to the net inductive reactance.

The phase shifting element is continuously operable over a portion of the range included between the two FET conductive states just discussed. While the phase shifting element may operate between the full range, satisfaction of requirements other than the phase shift range may dictate less than the available range. Within the desired range of adjustment, the network impedance commences at a low resistance at maximum conductance with significantly higher and thus negligible reactances in parallel. This relation, changes gradually as conduction is reduced. While the net inductive reactance remains fixed, the serial resistance of the FET becomes significantly higher, and thus negligible, allowing the network impedance to end at a net inductive reactance state at minimum conductance. While the capacitance of the FET may decline slightly in going from the conductive to the nonconductive state, the primary effect of increasing FET resistance is to allow the pre-arranged lower inductive reactance to govern the serial current flow. Thus, as the increase in negative gate voltage progresses, the phase shifting element, starting from an approximately resistive state, becomes progressively more and more inductive. However, the capacitive reactance, which must be present in practical FETs, must not be neglected in the optimization process, as will subsequently be described.

In a practical phase shifting element, the transmission line should be of less than $\frac{1}{4}$ wavelength electrical length, allowing the transmission to be representable by a serial inductance with the two shunt capacitances as earlier noted, and a phase range of 45 electrical degrees. Meeting the other requirements of a practical phase shifting element may reduce these limits to a lower value.

A useful figure of merit for a variable resistance FET in a high frequency phase shift application is that there be a high ratio of capacitive reactance when the FET is non-conductive (the off resistance paralleling the resistance normally being very high and negligible) to resistance when the FET is on. The foregoing factor enters into several of the properties of the phase shifter design including both optimizing the loss and the operating bandwidth.

A second useful figure of merit, which is related to the practical application, is that the on resistance of the FET should be low relative to the characteristic impedance of the transmission lines (e.g. 11 and 13) into which the phase shifter is connected. This property minimizes reflections when the FET is most highly conductive and produces a low VSWR (return loss) and a low insertion loss. Finally, the presence of capacitive coupling between the principal electrodes T1 and T2 which is unavoidable, but may be reduced in the practical design, need not preclude good phase shifting performance since it may be usefully combined with the inductance of the shunt transmission line 12 to provide some resonance enhancement suitable for achieving efficient VSWR and insertion loss performance when the FET is in a reduced conductance state corresponding to a maximum phase shift. Resonance must be avoided because of the discontinuity at resonance in phase shift and the unacceptable increase at resonance in the serial impedance of the shunt combination. In practice, wider operating bandwidths result when the band of operation of the shunt combination is below (rather than above) resonance.

Figure 3A:
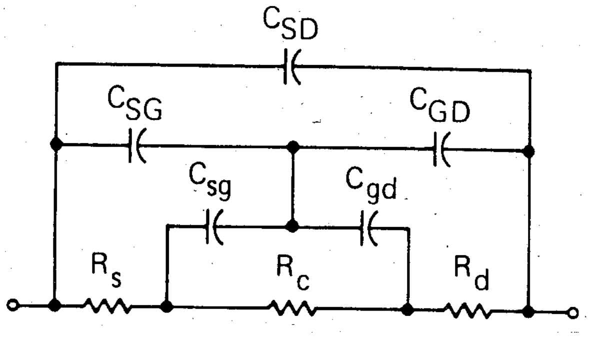
FIGS. 3A, 3B, 3C and 3D are equivalent circuit representations of a variable resistance MESFET suitable for use in the continuously variable phase element.
Figure 3B:
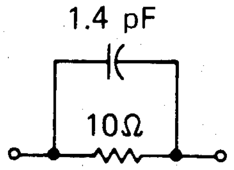

The properties of a variable resistance FET suitable for application to the present application and expressed in equivalent circuit representations are illustrated in FIGS. 3A, 3B, 3C and 3D. FIGS. 3A and 3B illustrate the on state equivalent circuit of a silicon-on-sapphire (SOS) MESFET suitable for operation in the 4 GHz frequency range. The illustrated FET is of an interdigitated design having a 3500 micron gate width, designed for a 10% relative bandwidth. FIG. 3A is a complex equivalent circuit illustrating the components of resistance and capacitance of the MESFET. In particular, the serial resistances comprise the source resistance ($R_s$), the channel resistance ($R_c$), and the drain resistance ($R_d$). The capacitive network includes the source-to-gate ($C_{sg}$) and gate-to-drain ($C_{gd}$) capacitances in the bulk; the source-to-gate ($C_{SG}$), the gate-to-drain ($C_{GD}$) and the source-to-drain ($C_{SD}$) capacitances in air. The reduced "on state" equivalent circuit comprises a 1.4 picofarad capacitance ($C_{on}$) shunted by a 10 ohm resistance ($R_{on}$).

Figure 3C:
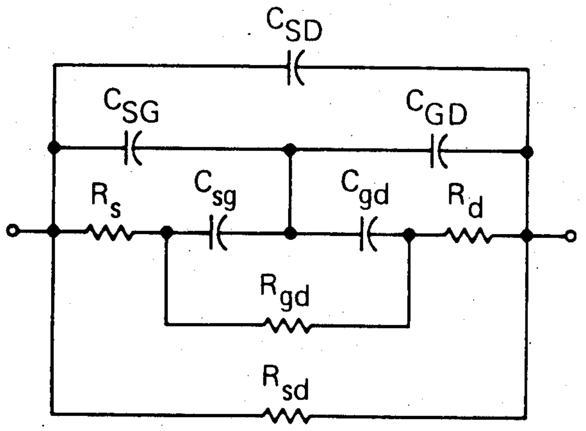
Figure 3D:
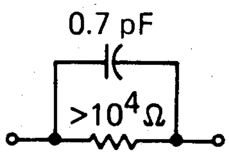

FIGS. 3C and 3D illustrate the "off state" equivalent circuit diagram of the same SOS MESFET. Here, the complex "off state" equivalent circuit of FIG. 3C is like that of the "on state" of FIG. 3A, except for an additional source to drain resistance $R_{sd}$ connecting input to output. The reduced equivalent circuit of FIG. 3D is in the same form as in FIG. 3B, but with differing values. For the same device, the capacitance ($C_{off}$) ia 0.7 pf and the resistance $R_{off}$ is $10^4$ ohms.

FIGS. 4A and 4B illustrate on and off state equivalent circuits of a SOS MESFET using the symbols of FIGS. 3A–3D and distributing them over a simplified cross section of the applicable MESFET semiconductor structure. The drawing additionally illustrates depletion mode operation of the FETs with zero applied drain to source bias voltage. The FETs are designed to be normally on with no gate bias. (When FETs are designed for operation in this mode, they have no gain, but become variable resistance elements, and the signal direction through the devices may be reversed.)

In the SOS MESFET construction illustrated in FIGS. 4A and 4B, the cross sections are of silicon supported upon a sapphire substrate (not shown). The silicon region is typically 1 micron in thickness while the sapphire substrate is normally 0.017". On the lowermost surface of sapphire is the continuous ground plane 22 required for the microstrip line. The ground plane consists of a 1000 Å titanium layer and a 20,000 Å gold layer.

The structure of the MESFET is modified for variable resistance, zero gain, bidirectional operation. The N+ degenerative diffusions to the right and to the left of the central channel region are both electroded on the top surface of the FET. These electrodes, illustrated in FIG. 4A, are elements of a larger interdigitated electrode structure and the "principal" electrodes of the FETs. While the leftmost electrode 17 is indicated to be the source and the rightmost electrode 18 to be the drain, the terms are interchangeable in the present application. The gate 19 is centrally placed over the n-type implanted channel between the source and drain for bidirectional operation. The gate is in contact with the N channel region to form a Schottky barrier gate. The gate electrode illustrated in FIGS. 4A and 4B is an element of a larger interdigitated gate structure. (The term MESFET denotes that the gate electrode is metallic and in contact with a semiconductor channel region.) The small area directly underneath the gate electrode and lying within the n-type implanted silicon channel is a depletion region which naturally exists at the metal semiconductor face under a metallic gate electrode. It is a region depleted of carriers (electrons). Current in the channel is constricted to the upper n-type condition dictates that the phase shift element present a low serial impedance relative to the characteristic impedance of the transmission line.

The figure of merit applied to the variable resistance FET earlier discussed, implies that the ratio of "off" reactance to "on" resistance should be high. Consistent with this requirement, one concludes that a resonant enhanced (LC) switched phase bit is preferable to a purely capacitive switched phase bit at the higher frequencies attainable by realizable devices.

Figure 5:
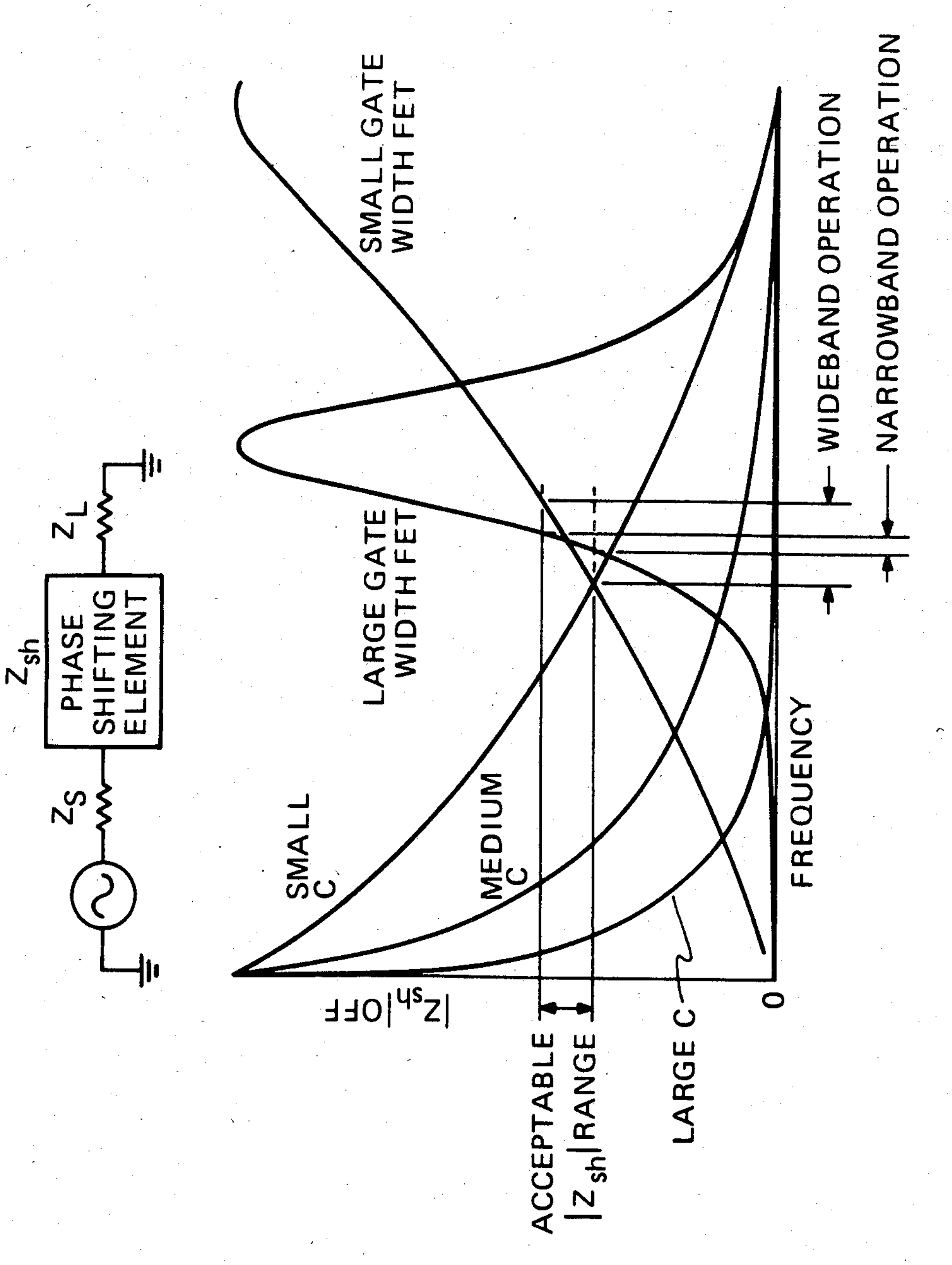
FIG. 5 is a family of curves explaining the design optimization of the phase element.

In the event that one should wish to employ a purely capacitive switched phase element, which one would visualize as an FET having unavoidable through-capacitance in both the "off" and "on" condition and high conductivity in the "on" condition, the plots of FIG. 5 of small, medium and large switches "Cs" are significant, relevant to design optimization. The C curves generally state that to obtain a given magnitude of serial impedance, which directly determines the amount of phase shift producible in the "off" condition of the switch, one needs a very small C. A large C will operate only at low frequencies, while a medium C at somewhat higher frequencies, and the smallest attainable C at the highest attainable frequencies. With realizable FET devices, performance in the higher frequency spectrum, however, is limited by the ability to achieve a small enough C to achieve the desired large capacitive reactance $|Z_{sh}|$. A second related problem is that to achieve a small C, the switching device must be small, and this (at high frequencies) increases the "on" resistance. An unduly high "on" resistance reduces the figure of merit of the switch. In practical terms, a lower figure of merit means that the impedance difference between "on" and "off" states will be smaller, and a smaller phase shift will be produced. It also means that the VSWR for the phase shifting element in the "on" condition will be worsened by the mismatch created by the low conductivity serial switch.

These considerations lead to using a resonant enhanced mode of operation, as taught in the present application, wherein a shunt inductance is provided around a specified FET. The use of a resonating inductance allows one to get higher reliable $|Z_{sh}|$ when one is operating at the higher frequency limits of a given FET (e.g. one having a specific "off" reactance due to interelectrode capacity). The two peaked curves of FIG. 5 are respectively one resonant curve with a large FET design having a sharp resonance peak, and a second curve shown to the left with a small FET design having a broad resonance peak. In both cases, it is assumed that a given $|Z_{sh}|$ at a given frequency is sought. In the illustration, it is assumed that the $|Z_{sh}|$ may be achieved by either resonantly enhanced design but is out of reach of a comparable pure C, phase element.

If the FET which will achieve the desired off $|Z_{sh}|$ is selected to be at the larger end of the design range (i.e., the larger gate width), then the larger design will operate with lower losses, a higher "Q" and a more sharply peaked resonance. To operate on the skirt at a desired "Z", the slope of $|Z_{sh}|$ versus frequency will be greater, and for a given tolerable phase error percentage, the bandwidth of operation will be smaller.

If an FET is selected with a smaller geometry (gate width), then a greater bandwidth is achievable (at the same $|Z_{sh}|$ and phase error). Thus, if bandwidth is the principal criterion, the smaller device is dictated. However, the "on" $|Z_{sh}|$ condition still influences the design compromise. Smaller devices have worsened VSWRs due to the larger on state resistances.

The tuning of the phase element, as noted above, is such that the signal frequency is below the resonant frequency of the phase element so as to provide a net inductive reactance, including the capacitive reactance provided by the FET switch. Near resonance the phase shift for a transmitted wave goes through a sudden reversal reaching a near maximum value as the resonant frequency is approached, falling rapidly to zero at resonance and just above resonance reaching a near maximum value of opposite sense. This nonlinearity in phase with frequency dictates that one operate well away from the peak resonance region. Operatinq below resonance (inductive) is the preferred mode for wide bandwidths.

In the design, the characteristic impedance of the input and output transmission lines 11, 13 have the same value (approximately 50 ohms). The shunting line 12 is designed to an impedance and length such that the desired inductive contribution is achieved over the frequency band of interest. In general, the characteristic impedance of the shunting transmission line 12 should be high to minimize its length and reduce the equivalent shunt capacitance to ground. However, if the impedance is made too large (e.g., over 100 ohms), then the transmission line conductor losses increase and the phase shifter insertion loss increases.

In the foregoing description, it has been assumed that the frequency of operation of the example is about 4 GHz; that the characteristic impedances of transmission lines 11 and 13 are 50Ω, the transmission line 12 70Ω, and the FET of 5000 microns gate width, dimensioned to exhibit a 10Ω on state and a $10^{+4}$ Ω off state. The FET capacity exhibits a reactance of 50 ohms in the off state and 25 ohms in the on state. The shunt line exhibits a reactance of 20 ohms. The phase performance is approximately tha illustrated in FIG. 7.

Summarizing the optimization of phase shift return loss and insertion loss, the shunt network is treated as consisting of the $\pi$ network earlier described, with the shunting C and variable R being provided by the FET. The three parallel element series (see FIG. 5) circuit is then adjusted to achieve a maximum phase shift consistent with the desired three-way optimization. The inductive reactance is chosen to be less than that of the FET (when off) so that the net serial impedance of the shunt combination will be suitably less than the characteristic impedances of the first and third transmission lines to optimize phase shift, insertion loss and return loss over the desired band of frequencies. In the practical selection of reactance values, the resonant frequency is set above the desired band to produce an enhanced dependence of serial impedance upon Q, adjustment of the conductivity of the FET, varying the relation of reactance to resistance, and producing a variation in the Q, the proximity to resonance having been selected for the desired three-way optimization over the band.

The phase shifting element herein described can be used at frequencies from approximately 1 to 20 GHz, depending upon the tolerable size of the substrate which establishes the lower frequency operating limit and high frequency performance of the variable resistance FET, which establishes the higher frequency operating limit. The materials which have been found to have good operating characteristics at high frequencies have been silicon-on-sapphire and gallium arsenide. The GaAs MESFET design (with a metal contact to the channel region by the p-type under surface. A second depletion region is shown where the P region abuts the surrounding source, gate and drain n-type implanations.

Variable resistance, no gain, bidirectional FET operation occurs as follows. When the FET is conducting, electron carriers may flow via the channel region between source 17 and drain 18 (or the reverse), assuming zero source to drain bias, and that the gate is maintained at a zero bias. If a highly negative gate potential is applied, the depletion region immediately under the gate electrode is expanded downward across the channel to the P layer and "pinch-off" occurs terminating conduction. Pinch-off implies that the region directly under the gate is depleted of carriers (electrons) forming a vertical barrier to lateral conduction through the channel. The P-implanted layer is provided to permit pinch-off at a lower gate voltage.

The dimensioning and design of the MESFET is best shown in FIG. 2. The MESFET T1 of the present invention includes a plurality of source contacts 17 interdigitated with a plurality of drain contacts 18 for a MESFET structure having a plurality of gates 19 disposed respectively between each source and drain pair. The vertical conductor to the left of the FET T1 and making contact with the transmission line 12 is a continuation of the source electrode, interconnecting the elements of the source electrode (shown in cross section in FIGS. 4A and 4B) to the transmission lines 11 and 12. Similarly, the interrupted vertical conductor to the right of it, making contact with the transmission line 12 are parts of the drain electrode, interconnecting the elements of the drain electrode 18 (whose cross sections are illustrated in FIGS. 4A and 4B) to the transmission lines 12 and 13. The interrupted vertical conductor interposed between the two vertical conductors of the drain electrode is a part of the gate electrode 19, the vertical conductor of the gate being connected to the control pad 20 and connected via a sequence of branched metallizations to the very fine digits (also illustrated in FIGS. 4A and 4B). The gate pad 20 is connected via an implanted resistor R1 to the pad 21 which is connected to the control line 16. (As earlier noted, the principal electrodes, i.e. source and drain, are interchangeable in variable resistance operation.) Depending on the application, the MESFET may use more or fewer drain-gate-source combinations. The MESFET performance is controlled by lengthening or shortening respectively the drain-gate-source combinations.

The MESFET construction is further illustrated in FIGS. 4A and 4B which shunts the cross section of a single drain-gate-source combination. In the silicon-on-sapphire (SOS) design, the source and drain regions employ N+ type silicon disposed upon a sapphire substrate (not illustrated). Channel regions are provided for implanting a P− doping material in predetermined locations between the N+ regions. A shallow channel is formed on top of this intermediate P layer of N− material. An insulating layer of silicon dioxide $SiO_2$ is formed at the boundaries between the source and gate regions and the drain and gate regions to provide electrical isolation. The metallizations for the source contacts, drain contacts and gate contacts are deposited simultaneously, normally at the same time as the transmission lines.

The dimensioning of the interdigital MESFET and bidirectional variable resistance operation requires optimization of the ratio of capacitive reactance when off to resistance when on. This ordinarily dictates that the doping in the gate region ($N_g$), the thickness of the gate region T, the length of the gate region $L_g$ and the width of the gate region $W_g$, all be selected for such optimization. At 4 GHz, the doping $N_d$ is $3\times10^{17}$ per cc, the thickness of the gate region is 0.5 microns, the length of the gate region is 2 microns ($L_g$) and the width of the gate region ($W_g$) is 3500 microns. More particularly, increasing these four parameters tends to (desirably) reduce the on state resistance, while tending to undesirably increase the capacitance. The FET design accordingly must reach a compromise dependent upon the practical application.

The dimensioning and design of the MESFET is for high frequency (>1GHz) operation in the bidirectional, variable resistance mode.

Assuming that a FET such as the one disclosed has been selected to operate in a passive, variable mode and that it exhibits a useful figure of merit (a high ratio of capacitive reactance when off to resistance when on) and a low insertion loss (a low on resistance in relation to the characteristic impedance of the microstrip transmission line), one must suitably tune the arrangement to achieve a predetermined differential phase shift over a calculated bandwidth. The short line 12 shunting the FET T1 is made of a length suitable for creating a series inductive reactance over the operating band of frequencies, which in cooperation with the FET off capacitance, makes possible a resonance enhanced increase in impedance. When the series impedance is a parallel L, C and R as shown in FIG. 1B, the series off impedance (neglecting R) of the shunt combination is:

$$Z_{sh\ off} = j\omega L/(1-\omega^2 LC) = j\omega L/(1-\omega^2/\omega_0^2) \quad (1)$$

L is the inductance, W is the instantaneous frequency measured in radians per second, and where $W_0$ is the frequency of resonance C is the FET off capacitance, and R is the resistance of $T_1$ (off). Since R in the off state is significantly larger ($10^4$ ohms) than the other reactive quantities in the off state, it would set a finite limiation on the $Z_{sh\ off}$ and on the circuit Q, but have no effect on the frequency of resonance (as would a virtual resistance in series with the inductance or capacitance). If the operating frequency is below the resonant frequency, the $Z_{sh\ off}$ is inductive.

Issues in optimizing the design of the phase shifting element to a practical application are illustrated in FIG. 5. In FIG. 5, the series off impedance ($Z_{sh\ off}$) for a variety of impedances representative of its phase shifting element are plotted against frequency. The equivalent circuit in which the phase shifting element is placed is included in the illustration. An R.F. source is assumed having a source impedance $Z_s$. The source is coupled via the phase shifting element to a load $Z_L$.

The design requires the phase shifting element to provide a predetermined phase shift over a predetermined band of frequencies. In the zero or low phase shift mode there should be minimum reflections at the phase shifting element for a good VSWR, assuming that the series impedance of the phase shift element in the on state may be neglected. This generally indicates that the source impedance should equal the load impedance. This requirement is met by making the characteristic impedances of the transmission lines (11 and 13) into and out of the phase shift element equal. The requirement of a low VSWR in the low phase shift (FET on)

region) in which the semiconducting region is gallium arsenide disposed upon a semi-insulating gallium arsenide substrate appears to have the best high frequency properties of current devices. For instance, using a 1 micron gate length, the theoretical cut-off frequency for switching mode operation is between 200 and 300 GHz. Practical ranges are smaller. Comparable cut-off frequencies are 50 GHz for a SOS MOSFET (metal-oxide, etc.) design and 25 GHz for a SOS (MESFET) design. The preferred embodiment uses a bidirectional depletion mode FET, not exhibiting gain and a narrowed gate. The bidirectional feature permits the phase bit to be inserted into the path to an antenna array, in which the transmitted and received signals propagate in opposite directions.

The resulting phase shifting element is small in size due to the short lengths of the transmission lines. The monolithic design combining the shunting transmission line and the FET provides several benefits. The first is that the two major FET electrodes (i.e., source and drain) are maintained at the same dc potential. This greatly simplifies the dc bias circuit. A second advantage of using this transmission line, when operating on the low side of resonance (inductive), is that the FET off capacitance now has only a second order effect on the net off reactive impedance, i.e., the differential phase shift errors due to manufacturing tolerances on the FET capacitances will be low. The manufacturing process results in relatively more accurate microstrip transmission line conductor widths and therefore more accurate inductive impedances. The more accurate transmission lines provide more accurate off impedances and hence more accurate differential phase shifts. The monolithic fabrication results in a phase shifting element entirely on a single substrate without the need for wire bonds connecting the transistors to the transmission lines. The bottom surface of the substrate is ground, which simplifies the circuit mounting.

What is claimed is:

1. A variable phase shifting element for electrical signals operable over a selected band of frequencies and suited to integrated fabrication, comprising:

A. a first transmission line for interconnection to electrical signals;

B. a variable resistance Field Effect Transistor (FET) having two principal electrodes and a gate electrode for control of conduction between said principal electrodes, the net impedance of said FET being primarily capacitively reactive when said gate is biased off and primarily resistive when said gate is biased on over said band, a first principal electrode of said FET being connected to said first transmission line;

C. a second transmission line exhibiting an inductive reactance over said band, said second transmission line being connected between said principal electrodes to form with said FET a parallel combination;

D. a third transmission line of interconnection, connected to the second principal electrode of said FET, the electrical signals transmitted through said phase shifting element, when said FET is maximally conductive, passing substantially undivided through said FET to effect a first phase shift; and when said FET is turned off, said signals dividing at said parallel combination to effect a second phase shift differing from said first phase shift; and E. means for applying a control potential to said gate to cause said FET to assume a selected conductivity limited by said off state and said maximally conductive, on state, to effect a desired phase shift.

2. A variable phase shifting element as set forth in claim 1 wherein said second transmission line, which has an electrical lenqth of less than approximately $\frac{1}{4}$ wavelength, may be represented by an equivalent $\pi$ network, exhibiting a series inductive reactance with shunting input and output capacitances, the parallel combination of the inductive reactance of said transmission line with the capacitive reactance of said FET, when not maximally conductive, exhibiting a net serial impedance whose reactive part is inductive over said band to achieve the desired phase shift.

3. A variable phase shifting element as set forth in claim 2 wherein the characteristic impedances of said first and third transmission lines are approximately the same, and wherein the on state resistance of said FET is low in relation to said transmission line impedances to minimize reflections and insertion loss when said FET is on.

4. A variable phase shifting element as set forth in claim 3 wherein the capacitive reactance of said FET when off, is greater than the resistance of said FET when on, over said band, for optimizing loss and bandwidth.

5. A variable phase shifting element as set forth in claim 4 wherein the shunt combination of the resistance and capacitive reactance of said FET as it becomes less conductive and the inductive reactance of the equivalent $\pi$ network representing said second transmission line are selected to optimize phase shift, insertion loss and return loss over said band.

6. A variable phase shifting element as set forth in claim 5 wherein the inductive reactance of said second transmission line is less than the capacitive reactance of said FET when off; adjustment of the conductivity of said FET producing a progressive conversion of the low serial resistance of the shunt combination in the FET on state to an impedance which is a predominantly inductive reactance in the FET off state, the net serial impedance of the parallel combination being selected in relation to the characteristic impedances of said first and third transmission lines to optimize phase shift, insertion loss and return loss over said band.

7. A variable phase shifting element as set forth in claim 6 wherein the inductive reactance of said second transmission line and the capacitive reactance of said FET when off are selected to resonate at a frequency above said band, the proximity of said band to the resonant frequency producing an enhanced dependence of serial impedance of said shunt combination upon Q, adjustment of the conductivity of said FET, varying the relation of reactance to resistance, and producing a variation in said Q, said proximity to resonance having been selected to optimize phase shift, insertion loss and return loss over said band.

8. A variable phase shifting element as set forth in claim 7 wherein said transmission lines and said FET are formed on a common monolithic substrate having a semiconducting region on one surface, said transmission lines being unbalanced, being formed by conductors of defined widths interconnecting said FET on said one surface of the substrate and a continuous conductive layer on the other surface of said substrate.

9. A variable phase shifting element as set forth in claim 8 wherein said variable resistance FET is designed for bilateral operation, the principal electrodes of said FET being maintained at equal dc potentials, and the gate electrode being placed between said principal electrodes to provide equal conductance operation in either direction of transmission.

10. A variable phase shifting element as set forth in claim 1 wherein said variable resistance FET is a MESFET, i.e. a metal (gate) semiconductor field effect transistor.

11. A variable phase shifting element as set forth in claim 10 wherein said MESFET comprises:

a semiconducting region disposed upon a crystalline substrate having a first and a second plurality of interdigitated regions therein, said principal electrodes comprising a first and a second interdigitated contact disposed on said first and second interdigitated regions, respectively; and a plurality of gate regions each disposed between adjacent pairs of regions of said first and second pluralities of interdigitated regions, respectively, said gate electrode comprising a metal contact disposed on each gate region.

12. A variable phase shifting element as set forth in claim 11 wherein said MESFET is designed for bilateral operation, said second transmission line maintaining the the principal electrodes of said FET at equal dc potentials, and said gate regions are placed between said first and second pluralities of interdigitated regions for equal conductance operation in either direction of transmission.

13. A variable phase shifting element as set forth in claim 12 wherein said first plurality of regions are of a first type conductivity, the individual regions thereof extending in mutually spaced parallel relationships; and said second plurality of regions are of said first type conductivity, the individual regions of said second plurality of regions extending generally parallel to said first plurality of regions and being interdigitated therewith in mutually spaced parallel relationships.

14. A variable phase shifting element as set forth in claim 13 wherein said plurality of gate regions each comprise an upper layer of said first type conductivity overlaying a layer of a second type conductivity opposite said first type conductivity for depletion mode operation, said metal gate contact being disposed on said upper layer.

15. A variable phase shifting element as set forth in claim 14 wherein said second transmission line, which has an electrical length of less than approximately $\frac{1}{4}$ wavelength, may be represented by an equivalent $\pi$ network, exhibiting a series inductive reactance with shunting input and output capacitances, the parallel combination of the inductive reactance of said transmission line with the capacitive reactance of said FET, when not maximally conductive, exhibiting a net serial impedance whose reactive part is inductive over said band to achieve the desired phase shift.

16. A variable phase shifting element as set forth in claim 15 wherein the characteristic impedances of said first and third transmission lines are approximately the same, and wherein the on state resistance of said FET is low in relation to said transmission line impedances to minimize reflections and insertion loss when said FET is on.

17. A variable phase shifting element as set forth in claim 16 wherein the capacitive reactance of said FET when off, is greater than the resistance of said FET when on, over said band, for optimizing loss and bandwidth.

18. A variable phase shifting element as set forth in claim 17 wherein the parallel shunt combination of the resistance, and capacitive reactance of said FET as it becomes less conductive and the inductive reactance of the equivalent $\pi$ network representing said second transmission line are selected to optimize phase shift, insertion loss and return loss over said band.

19. A variable phase shifting element as set forth in claim 18 wherein the inductive reactance of said second transmission line is less than the capacitive reactance of said FET when off; adjustment of the conductivity of said FET producing a progressive conversion of the low serial resistance of the shunt combination in the FET on state to an impedance which is a predominantly inductive reactance in the FET off state, the net serial impedance of the parallel combination being selected in relation to the characteristic impedances of said first and third transmission lines to optimize phase shift, insertion loss and return loss over said band.

20. A variable phase shifting element as set forth in claim 19 wherein the inductive reactance of said second transmission line and the capacitive reactance of said FET when off are selected to resonate at a frequency above said band, the proximity of said band to the resonant frequency producing an enhanced dependence of serial impedance of said shunt combination upon Q, adjustment of the conductivity of said FET, varying the relation of reactance to resistance, and producing a variation in said Q, said proximity to resonance having been selected to optimize phase shift, insertion loss and return loss over said band.

21. A variable phase shifting element as set forth in claim 20 wherein said transmission lines and said FET are formed on a common monolithic substrate having a semiconducting region on one surface, said transmission lines being unbalanced, being formed between defined conductors interconnecting said FET on said one surface of the substrate and a continuous conductive layer on the other surface of said substrate.

22. A variable phase shifting element as set forth in claim 19 wherein said semiconducting region comprises silicon disposed upon a sapphire substrate.

23. A variable phase shifting element as set forth in claim 19 wherein said semiconducting region comprises gallium arsenide disposed upon a semi-insulating gallium arsenide substrate.

24. An integrated circuit, continuously variable, bidirectional phase shifter comprising:

a variable resistance MESFET having a source, drain, and gate contacts;

a shunting transmission line exhibiting an inductive reactance connected between source contacts and drain contacts of said MESFET, the transmission line connection equalizing the source and drain DC potentials for bidirectional MESFET operation; and means for connecting a variable DC control potential to the gate contact of said MESFET to vary the conductivity thereof for continuous phase adjustment.

* * * * *